United States Patent
Bollam et al.

(10) Patent No.: US 12,289,919 B1
(45) Date of Patent: Apr. 29, 2025

(54) BUFFERED TOP THIN FILM RESISTOR, MIM CAPACITOR, AND METHOD OF FORMING THE SAME

(71) Applicant: GlobalFoundries Singapore Pte. Ltd., Singapore (SG)

(72) Inventors: Venkata Mangathayaru Bollam, Singapore (SG); Qiying Wong, Singapore (SG); Yudi Setiawan, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/637,915

(22) Filed: Apr. 17, 2024

(51) Int. Cl.
| | |
|---|---|
| H10D 84/00 | (2025.01) |
| H01L 23/48 | (2006.01) |
| H10D 1/47 | (2025.01) |
| H10D 1/68 | (2025.01) |

(52) U.S. Cl.
CPC ......... H10D 84/206 (2025.01); H01L 23/481 (2013.01); H10D 1/474 (2025.01); H10D 1/711 (2025.01)

(58) Field of Classification Search
CPC ............. H01L 27/0682; H01L 27/0794; H01L 27/224; H01L 23/481; H01J 2201/3125; H01J 2329/0484; H01J 1/312; H10B 61/10; H10D 84/206; H10D 1/474; H10D 1/711
See application file for complete search history.

(56) References Cited

U.S. PATENT DOCUMENTS

| | | | |
|---|---|---|---|
| 6,284,590 B1* | 9/2001 | Cha | H10D 1/692 438/957 |
| 6,730,573 B1* | 5/2004 | Ng | H10D 84/206 438/396 |
| 6,919,244 B1* | 7/2005 | Remmel | H10D 1/47 257/E27.025 |
| 7,535,079 B2* | 5/2009 | Remmel | H01L 23/5223 257/532 |
| 8,375,539 B2* | 2/2013 | Dunn | H01G 4/06 29/25.03 |
| 8,445,353 B1 | 5/2013 | Raghavan et al. | |
| 8,754,501 B2 | 6/2014 | Khan et al. | |
| 8,803,287 B2* | 8/2014 | Dirnecker | H01L 23/5223 257/532 |
| 9,064,719 B1* | 6/2015 | Zhou | H10D 84/811 |
| 9,275,992 B1* | 3/2016 | Tarabbia | H10D 84/206 |
| 9,318,531 B1* | 4/2016 | Mathur | H10B 61/10 |
| 9,806,032 B1* | 10/2017 | Lin | H01L 23/5223 |
| 10,290,701 B1* | 5/2019 | Chang | H10D 1/696 |
| 10,840,322 B2* | 11/2020 | Kande | H10D 86/85 |
| 11,264,378 B2 | 3/2022 | Chen et al. | |
| 11,545,486 B2* | 1/2023 | Feng | H10D 1/47 |
| 11,637,100 B2* | 4/2023 | Wong | H10D 1/474 257/532 |

(Continued)

Primary Examiner — Maliheh Malek

(57) ABSTRACT

A semiconductor device includes a dielectric layer over a back end of line (BEOL) metal layer, a metallic resistive layer over the dielectric layer, a resistor comprising a metallic resistive film that is a first portion of the metallic resistive layer, and a metal-insulator-metal (MIM) capacitor. The insulator of the MIM capacitor comprises at least two layers including a first layer that is a second portion of the metallic resistive layer and a second layer that is the dielectric layer.

20 Claims, 4 Drawing Sheets

(56) References Cited

U.S. PATENT DOCUMENTS

| | | | |
|---|---|---|---|
| 2003/0017699 A1* | 1/2003 | Zurcher | H10D 86/85 257/E21.582 |
| 2004/0241951 A1* | 12/2004 | Amadon | H01C 7/06 438/384 |
| 2007/0051951 A1* | 3/2007 | Chaparala | G01R 31/2875 257/48 |
| 2008/0003759 A1* | 1/2008 | Chinthakindi | H10D 1/68 257/E23.142 |
| 2012/0126369 A1* | 5/2012 | Lin | H10D 86/85 257/532 |
| 2012/0280358 A1* | 11/2012 | Huang | H10D 1/68 257/532 |
| 2013/0341759 A1* | 12/2013 | Khan | H10D 1/47 257/533 |
| 2014/0264751 A1* | 9/2014 | Chen | H10D 84/811 257/533 |
| 2015/0294936 A1* | 10/2015 | Shen | H10D 1/68 257/532 |
| 2015/0294970 A1* | 10/2015 | Jakushokas | H10D 1/47 257/533 |
| 2016/0064354 A1* | 3/2016 | Chadda | H05K 1/18 257/528 |
| 2016/0126239 A1* | 5/2016 | Singh | H01L 23/552 257/532 |
| 2017/0104031 A1* | 4/2017 | Clark | H10B 63/20 |
| 2019/0148370 A1* | 5/2019 | Hung | H10D 1/692 257/532 |
| 2019/0305074 A1* | 10/2019 | Kande | H01L 21/0214 |
| 2020/0035779 A1* | 1/2020 | Huang | H01L 21/31116 |
| 2020/0126976 A1* | 4/2020 | Chen | H10D 1/692 |
| 2021/0098363 A1* | 4/2021 | Linewih | H01L 23/5223 |
| 2021/0118981 A1* | 4/2021 | Tsai | H10D 1/692 |
| 2021/0288042 A1* | 9/2021 | Lin | H10D 1/47 |
| 2022/0108980 A1* | 4/2022 | Feng | H10D 84/206 |
| 2022/0302018 A1* | 9/2022 | Leng | H10D 1/47 |
| 2022/0399328 A1* | 12/2022 | Kaufmann | H10D 62/8503 |
| 2023/0046455 A1* | 2/2023 | Wong | H10D 1/474 |
| 2023/0064385 A1* | 3/2023 | Huang | H01L 23/5223 |
| 2023/0180485 A1* | 6/2023 | Brew | H10D 1/043 257/4 |

* cited by examiner

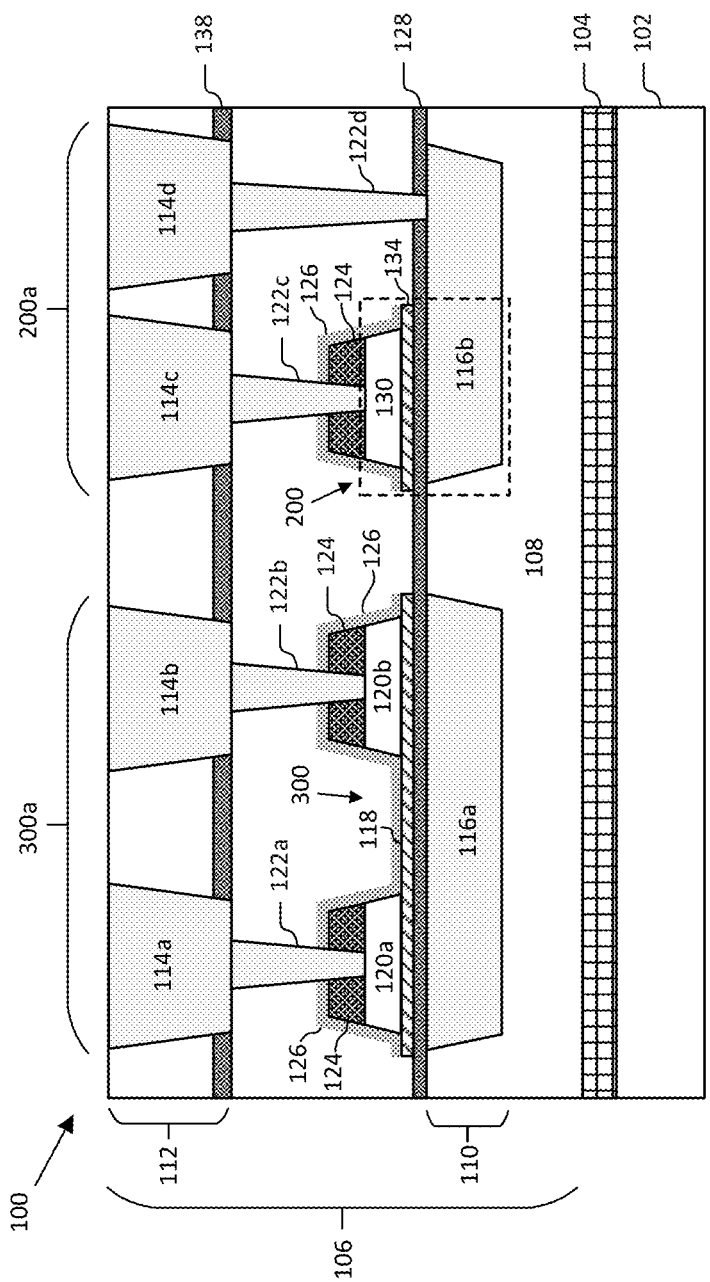
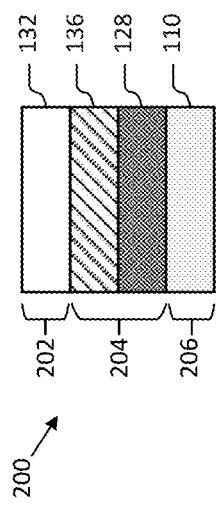
Figure 1
Figure 2

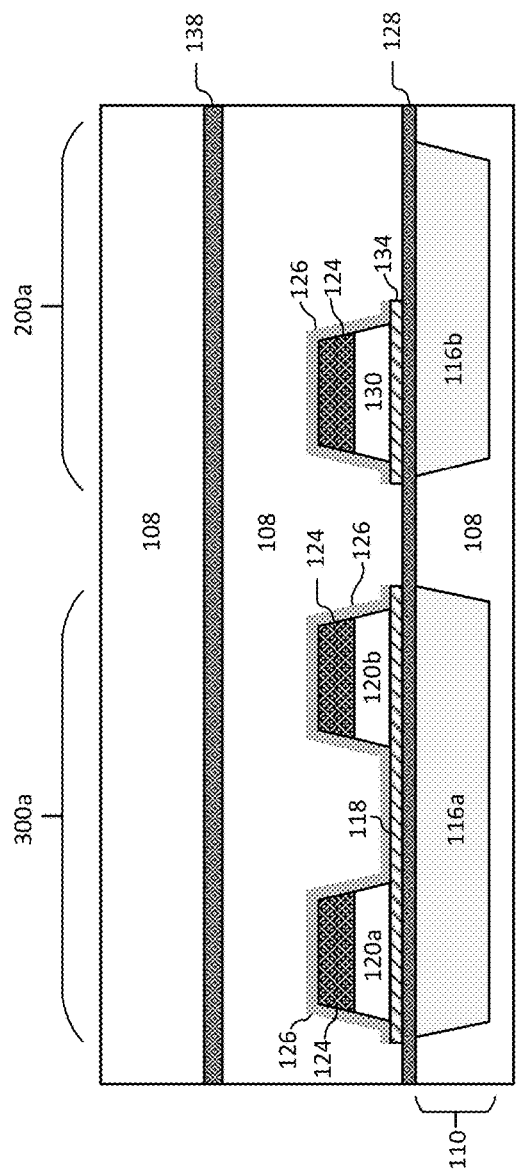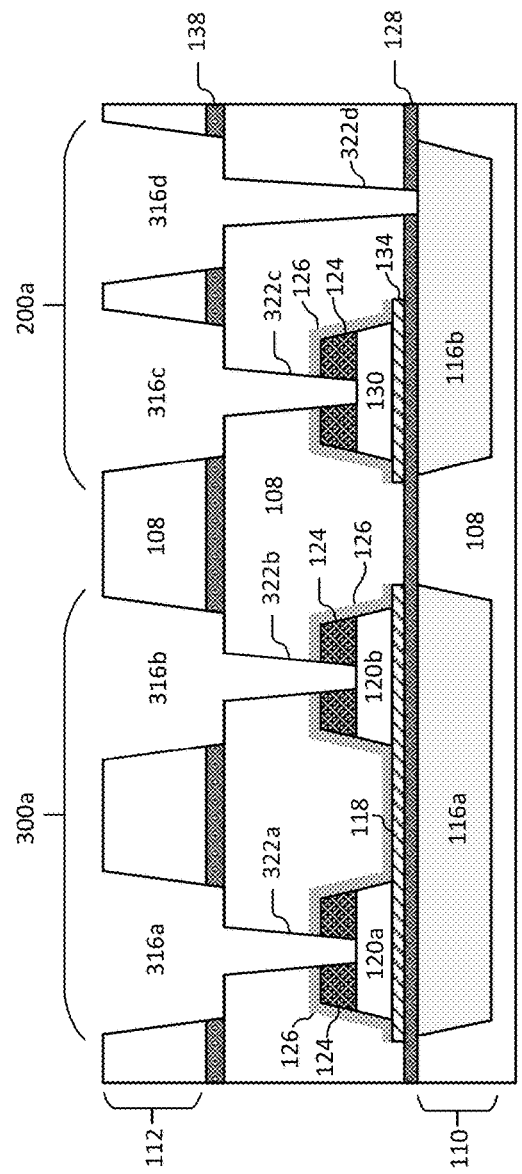

BUFFERED TOP THIN FILM RESISTOR, MIM CAPACITOR, AND METHOD OF FORMING THE SAME

BACKGROUND

The semiconductor industry's drive for higher density, higher performance, lower-cost devices, and the implementation of nanometer-scale process nodes have resulted in the development of various IC chips with increasingly smaller and more complex circuits. An IC chip can include numerous device components, such as, but not limited to, memory cells, transistors, capacitors, and optical/photonic components.

In many applications, passive circuit components such as capacitors and resistors can be formed in a back end of line (BEOL) portion of the IC chip. A MIM capacitor is an example of a capacitor that has an insulator sandwiched between two metal plates. A thin film resistor is an example of a resistor that employs a thin film with resistive properties. Formation of these components can involve several photolithographic processes, such as deposition, use of numerous masks, application of photoresist, etching, wet and dry cleaning, and wafer handling. These processes may incur high manufacturing costs. In addition, the photolithography and etching processes can result in misalignment issues, as well as punch through issues of the resistive layer when the etching process is used to form the electrical contact to the resistive film.

SUMMARY

Embodiments of the present application relate to a semiconductor device and a method of forming the photodiode device. The semiconductor device may include a capacitor and a resistor in a back end of line (BEOL) layer of the device.

In an embodiment, a semiconductor device includes a dielectric layer over a back end of line (BEOL) metal layer, a metallic resistive layer over the dielectric layer, a resistor comprising a metallic resistive film that is a first portion of the metallic resistive layer, and a metal-insulator-metal (MIM) capacitor. The insulator of the MIM capacitor may include at least two layers including a first layer that is a second portion of the metallic resistive layer and a second layer that is the dielectric layer.

In an embodiment, a semiconductor device includes a thin film resistor comprising a first portion of a metallic resistive layer and a metal-insulator-metal (MIM) capacitor. The MIM capacitor may include a metal structure in a BEOL metal layer, an insulator over the metal structure, the insulator including a first layer that is a second portion of the metallic resistive layer and a second layer that is a dielectric layer, and a first portion of a conductive layer over the insulator.

In an embodiment, a method of forming a semiconductor device includes forming a back end of line (BEOL) metal layer, forming a dielectric layer over the BEOL metal layer, forming a metallic resistive layer over the dielectric layer, forming a resistor comprising a first portion of the metallic resistive layer, and forming a metal-insulator-metal (MIM) capacitor, wherein the insulator of the MIM capacitor comprises at least two layers including a second portion of the metallic resistive layer and the dielectric layer.

BRIEF DESCRIPTION OF THE DRAWINGS

FIG. 1 illustrates a semiconductor device according to an embodiment.

FIG. 2 illustrates a metal-insulator-metal (MIM) capacitor according to an embodiment.

FIGS. 3A to 3F illustrate steps of a method of forming the semiconductor device of FIG. 1 according to an embodiment.

DETAILED DESCRIPTION

Figure 3A:
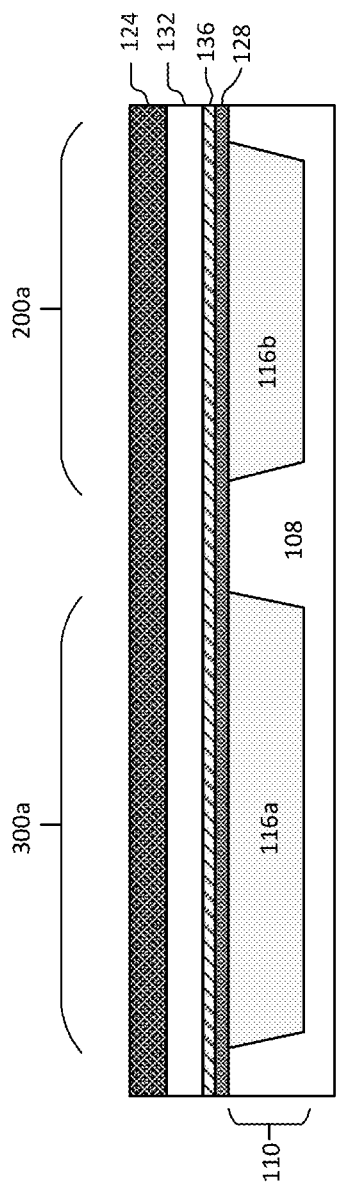

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured. The figures are not drawn to scale, and features are enlarged or diminished for visual clarity. In the context of specific values, the term "about" refers to amounts within typical manufacturing variation and engineering tolerances, e.g. plus or minus 5%. Certain features may be referred to as numbered elements to distinguish those features from one another. For example, three different portions of a feature may be referred to as first, second and third portions of the feature. However, such terminology is not absolute: for example, the same element may be referred to as a first portion in one embodiment, a second portion in another embodiment, etc.

FIG. 1 illustrates a semiconductor device 100 according to an embodiment of the present disclosure. The semiconductor device 100 may include a substrate 102 and an active region 104. The substrate may comprise one or more semiconductor material, and the active region 104 may comprise active components. Examples of active components may include diodes (e.g., single-photon avalanche diode) or transistors such as, but not limited to, planar field-effect transistor, fin-shaped field-effect transistors (FinFETs), ferroelectric field-effect transistors (FeFETs), complementary metal-oxide semiconductor (CMOS) transistors, and bipolar junction transistors (BJT). These active components may be formed in the front end of line (FEOL) portion of an IC chip.

In addition, the semiconductor device 100 includes a back end of line (BEOL) region 106. The BEOL region 106 of the device includes a dielectric material 108. The dielectric material 108 may include, but is not limited to, silicon dioxide, tetraethyl orthosilicate (TEOS), or a material having a chemical composition of $SiC_xO_yH_z$, wherein x, y, and z are in stoichiometric ratio. The dielectric material 108 may provide electrical insulation between conductive structures (e.g., interconnect vias, conductive lines, contact structures, etc.) in the BEOL region 106 of the device, and may be referred to as an interlayer dielectric (ILD).

The BEOL region 106 has a plurality of metal layers, or metallization layers, including a first metal layer 110 and a second metal layer 112. In an embodiment, the second metal layer 112 is a topmost metal level or top metal layer, and the first metal layer 110 is one level below the top metal layer. However, embodiments are not limited to this configuration—for example, the second metal layer 112 can be a metal level below the top metal layer, and the first metal layer 110 can be any metal level below the second metal layer 112.

A set of metal lines including metal lines 114a-d are located in second metal layer 112, and a set of metal structures including metal structures 116a and 116b are located in first metal layer 110. The metal lines 114a-d and metal structures 116a and 116b may include conductive materials such as copper, tantalum, tungsten, ruthenium, cobalt, titanium, nickel, platinum, aluminum, or an alloy thereof. A portion of the first metal lines 114 may be coupled to a portion of the second metal structures 116 by one or more via that is formed of one or more of the conductive materials listed above. In some embodiments, the metal structures 116a and 116b may function as conductive lines that enable routing of electrical signals. Accordingly, metal structure 116b may be a conductive line of the semiconductor device as well as a bottom plate of the capacitor 200.

The semiconductor device 100 includes one or more resistor 300 in a resistor region 300a of the device, and one or more capacitor 200 in a capacitor region 200a of the device. In some embodiments, additional IC components may be positioned between the capacitor region 200a and the resistor region 300a. Such components may include, but are not limited to, a memory device (e.g., resistive random access memory structure, magnetic random access memory structure, etc.), and an inductor. The resistor 300 and capacitor 200 are located between the first metal layer 110 and the second metal layer 112 of the semiconductor device 100.

The resistor 300 comprises a metallic resistive film 118 coupled between a first buffered contact 120a and a second buffered contact 120b. The metallic resistive film 118, as well as the metallic dielectric film 134, may be formed of a dielectric material capable of conducting electricity, such as, but not limited to, materials including a metal and a nonmetal, ceramic-metal (cermet) materials, silicon-chromium, nickel-chromium, titanium nitride, or tantalum nitride. In specific embodiments, the metallic resistive film 118 and the metallic dielectric film 134 may be a cermet material with a dielectric constant (K) of greater than about 5, or greater than about 10. The metallic resistive film 118 may have a thickness of about 20-100 angstroms. As explained in more detail below, both the metallic resistive film 118 and the metallic dielectric film 134 may be different portions of a metallic resistive layer 136 (see FIGS. 3A and 3B), and the metallic dielectric film 134 may be one layer of a multi-layer insulator of capacitor 200.

A first side of the metallic resistive film 118 may be coupled to a first buffer contact 120a and a second side of the metallic resistive film 118 may be coupled to a second buffer contact 120b. The first and second buffer contacts 120a and 120b may be formed of one or more conductive metal material such as tantalum, tungsten, aluminum, tantalum nitride, or titanium nitride, for example. The first and second buffer contacts 120a and 120b may have a thickness that is greater than the thickness of metallic resistive film 118. For example, the thickness of the first and second buffer contacts 120a and 120b may be from about 500 to 2000 angstroms. Although not shown in the two-dimensional cross-section of FIG. 1, portions of the metallic resistive film 118 can extend in two dimensions, e.g. in a serpentine configuration as known in the art to increase its length relative to the one-dimensional spacing between first and second buffered contacts 120a and 120b.

The first and second buffer contacts 120a and 120b may function as conductive buffer materials between the metallic resistive film 118 and respective first and second vias 122a and 122b. The first and second vias 122a and 122b, as well as third and fourth vias 122c and 122d, may include conductive materials such as copper, tantalum, tungsten, ruthenium, cobalt, titanium, nickel, platinum, aluminum, or an alloy thereof. The vias in the embodiment of FIG. 1 are interconnect vias which interconnect between the resistor 300 and metal lines 114a and 114b, and between the capacitor 200 and metal lines 114c and 114d.

The first and second vias 122a and 122b extend through an insulating layer 124 to land on the first and second buffer contacts 120a and 120b respectively. One advantage of buffer contacts 120a and 120b is reducing the possibility of punch-through that could otherwise occur if the first and second vias 122a and 122b were to land directly on the metallic resistive layer 118. The insulating layer 124 may be formed of a low-K dielectric such as silicon nitride, TEOS or SiCOH, although other materials are contemplated herein.

Structures of the first and second buffer contacts 120a and 120b and the insulating layer 124 over the buffer contacts are capped with a capping layer 126, which may extend over adjacent portions of the metallic resistive film 118 as shown in FIG. 1 and may function as a protective barrier. The capping layer 118 may be a low-K dielectric material such as, but not limited to, silicon dioxide, silicon oxynitride, silicon nitride, nitrogen doped silicon carbide, etc. A dielectric layer 128 separates the metallic resistive film 118 from metal structure 116a of the first metal layer 110.

Capacitor 200 may be a metal-insulator-metal (MIM) capacitor comprising a conductive metal plate 130. The conductive metal plate 130 may be formed from the same conductive metal layer 132 (see FIG. 3A) as the first and second buffered contacts 120a and 120b, and have the same material and thickness as the first and second buffered contacts 120a and 120b. For example, the conductive metal plate 130 may be formed of one or more conductive metal material such as tantalum, tungsten, aluminum, or titanium nitride, and the thickness of conductive metal plate 130 may be from 500 to 2000 angstroms.

The insulator portion 204 of MIM capacitor 200 may include two or more layers of dielectric materials. In the embodiment of FIG. 1, the insulator of capacitor 200 has two layers of material including metallic dielectric film 134 and dielectric layer 128. The dielectric constant of metallic dielectric film 134 may be higher than the dielectric constant of dielectric layer 128. For example, metallic dielectric film 134 may be formed of silicon chromium which has a dielectric constant of about 12, and dielectric layer 128 may be formed of silicon nitride which has a dielectric constant of about 5. A thickness of the dielectric layer 128 may be within a range of about 300 to 700 angstroms, for example.

FIG. 2 is a representational view of material layers that may be present in a MIM capacitor 200 according to an embodiment of the present disclosure. A top plate 202 of the MIM capacitor comprises a portion of a conductive metal layer 132 of the semiconductor device 100, the insulator 204 includes at least two layers including a first layer of metallic resistive layer 136 and a second layer of dielectric layer 128, and the bottom plate 206 includes a portion of first metal layer 110 of the device. Each of the layers in FIG. 2 is a layer of the device, and other portions of the layers may perform different functions in other regions of the device. For example, another portion of metallic resistive layer 136 may be a metallic resistive film 118 of resistor 300 in resistor region 300a, other portions of conductive metal layer 132 may be buffered contacts in resistor region 300a, other portions of first metal layer 110 may be conductive lines, etc. In an embodiment, the dielectric constant of the metallic resistive layer 136 is greater than the dielectric constant of the dielectric layer 128 by at least 5.

Although four specific layers are shown in FIG. 2, embodiments are not limited to this configuration. In other embodiments, additional layers may be present, including liner layers or additional layers of dielectric or conductive materials.

Using two material layers for the insulator of capacitor 200 has several advantages over using a single layer of material. The dielectric properties of an insulator with two dielectric layers are increased compared to an insulator with only one of those dielectric layers. In addition, using two dielectric layers provides design flexibility to adjust the characteristics of the capacitor since the thickness and material of each of the two layers can be changed independently of the other layer. This flexibility can be especially useful when the same metallic resistive layer 136 is used for the metallic resistive film 118 of resistor 300, so that the characteristics of the capacitor 200 can be adjusted by using a different thickness or material for dielectric layer 128 without affecting the metallic resistive layer 136.

The bottom plate 206 of capacitor 200 is provided by metal structure 116b, which is coupled to metal line 114d by fourth via 122d. On the other side of the capacitor 200, the conductive metal plate 130 is coupled to metal line 114c through third via 122c. The third via 122c extends through insulating layer 124 and lands on the conductive metal plate 130. The insulating layer 124 and the conductive metal plate 130 are covered by capping layer 126, which may extend over portions of metallic resistive layer 118 as well as shown in the figures.

FIGS. 3A to 3F illustrate an embodiment of a process of forming the semiconductor device 100 of FIG. 1. Techniques for forming the semiconductor device 100 include deposition techniques and patterning techniques. Exemplary techniques for deposition include, but are not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD). Patterning techniques may include deposition of material or photoresist, patterning, exposure, development, etching, cleaning, and/or removal of the material or photoresist as required in forming a described pattern, structure or opening. Examples of techniques for patterning include, but are not limited to, wet etch lithographic processes, dry etch lithographic processes or direct patterning processes. Such techniques may use mask sets and mask layers.

Referring to FIG. 3A, an initial structure includes metal structures 116a and 116b of first metal layer 110 formed in openings of a dielectric material 108. The metal structures 116a and 116b, as well as additional metal structures including metal lines, are formed in metal layer 110 using a damascene process. Subsequently, a dielectric layer 128 is deposited over first metal layer 110, a metallic resistive layer 136 is deposited over dielectric layer 128, a conductive metal layer 132 is deposited over metallic resistive layer 118, and an insulating layer 124 is deposited over conductive metal layer 132.

Figure 3B:
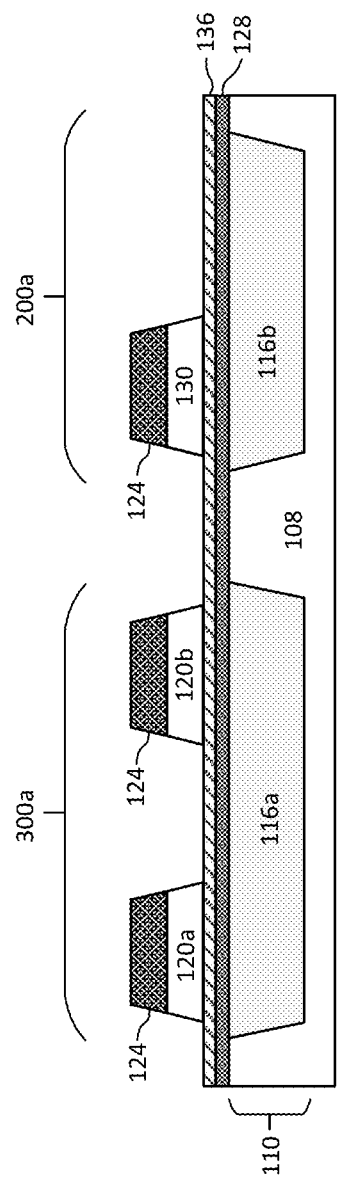

Referring to FIG. 3B, the dielectric layer 124 and the conductive metal layer 132 are patterned using a mask. The patterning of FIG. 3B forms the first and second buffered contacts 120a and 120b in the resistor region 300a and the conductive metal plate 130 in capacitor region 200a. In the embodiment of FIG. 3B, the first buffered contact 120a is a first portion of conductive metal layer 132, the second buffered contact 120b is a second portion of conductive metal layer 132, the conductive metal plate 130 is a third portion of conductive metal layer 132, and each of the first buffered contact 120a, the second buffered contact 120b and conductive metal plate 130 are coplanar.

Figure 3C:
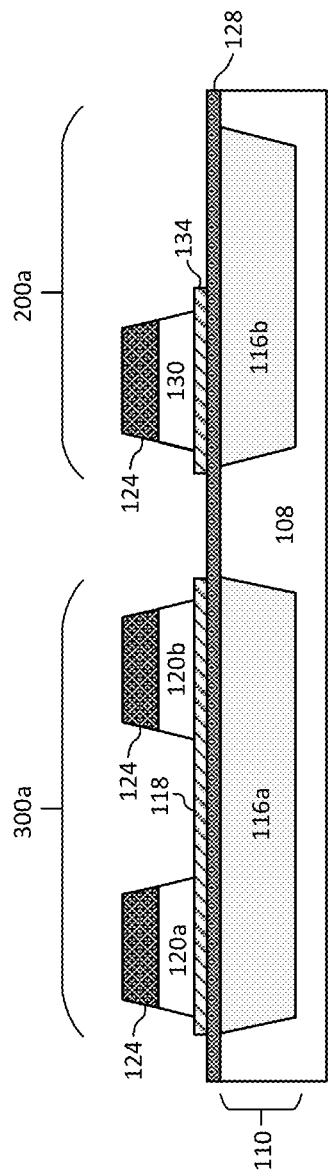

Referring to FIG. 3C, metallic resistive layer 136 is patterned to form the metallic resistive film 118 in resistor region 300a and the metallic dielectric film 134 in capacitor region 200a. Consequently, the metallic resistive film 118 may have the same material and thickness as the metallic dielectric film 134. The metallic resistive film 118 may be referred to as a first portion of metallic resistive layer 136, and the metallic dielectric film 134 may be referred to as a second portion of metallic resistive layer 136.

Figure 3D:
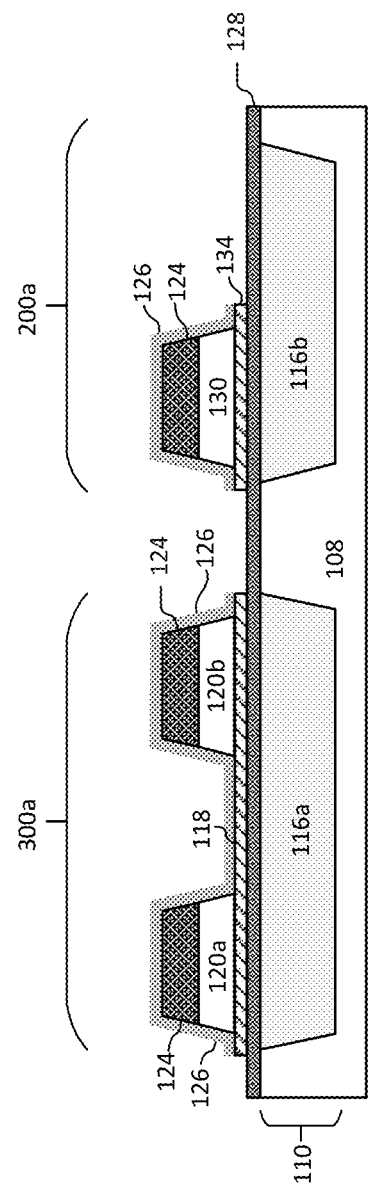

Subsequently, a layer of insulating material may be deposited over the top surface of the device structure shown in FIG. 3C using one of the deposition techniques described above. The insulating material may be a capping material such as silicon oxide or silicon nitride. Referring to FIG. 3D, the insulating material is patterned to form the capping layer 126 over top and side surfaces of the remaining portions of insulating layer 124 and to cover side surfaces of first and second buffer contacts 120a and 120b and conductive metal plate 130. In some embodiments, as seen in the figure, the patterned capping layer 126 covers the portion of metallic resistive film 118 between the first and second buffer contacts 120a and 120b.

Referring to FIG. 3E, a layer of dielectric material 108 is deposited over the structure shown in FIG. 3D. The dielectric material 108 may be the same interlayer dielectric material between each of the BEOL metal layers of the device. In an example, the dielectric material 108 is a silicon dioxide material that is deposited using a tetraethyl orthosilicate (TEOS) plasma-enhanced chemical vapor deposition (PECVD) process. After deposition, the TEOS may be leveled using a chemical mechanical polishing (CMP) process. A second dielectric layer 138 is deposited over the dielectric material 108, and then an additional layer of dielectric material 108 is deposited over the second dielectric layer 138. The second dielectric layer 138 may be the same material as dielectric layer 128, e.g. silicon nitride, but other material are contemplated herein.

Referring to FIG. 3F, two sets of openings 322a-d and 316a-d are formed in the structure of FIG. 3E using two separate patterning processes. In the first patterning process, a hole pattern comprising a set of via openings 322a-d may be formed to create openings for the vias 122a-d. The first patterning process may use the conductive material of conductive metal layer 132 and the metal material of first metal layer 110 as etch stop layers. For example, the patterning process may use an etch chemistry that is selective to the metal materials of conductive metal layer 132 and first metal layer 110. The first patterning process causes via hole 322a to land on first buffered contact 120a, via hole 322b to land on second buffered contact 120b, via hole 322c to land on conductive metal plate 130, and via hole 322d to land on metal structure 116b. A second patterning process forms openings 316a-d in second metal layer 112. The second patterning process may form a plurality of openings, e.g. trenches, in the second metal layer 112, including openings for additional metal structures such as metal lines and contact pads not shown in the figures.

The openings including via holes 322 and openings 316 may be filled using a dual damascene process. For example, a conductive barrier liner (not shown) may be deposited in the openings. The conductive barrier liner may serve to prevent or reduce the diffusion of atoms into or out of the conductive material in the interconnect features, while allowing electrical conduction therein. Exemplary materials for the conductive barrier liner may include, but are not limited to, titanium, titanium nitride, tantalum, or tantalum nitride. The barrier liner material is removed from the surface of the device using a levelling technique such as CMP, conductive material is deposited to fill the openings 322a-d and 316a-d, and a second levelling process is performed to remove conductive material from the surface of the device, resulting in the structure shown in FIG. 1.

Embodiments of the present disclosure represent a highly efficient semiconductor device 100 with excellent performance characteristics. Embodiments can be formed with minimal process steps to realize effective resistors and capacitors in a BEOL level of a device. Process steps are minimized by using coplanar portions of the same metallic resistive layer 136 for the metallic resistive film 118 of resistor 300 and the metallic dielectric film of capacitor 200. In addition, process steps are minimized by using coplanar portions of the same conductive metal layer 132 for buffered contacts 120a and 120b for the resistor 300 as well as the conductive metal plate 130 of the capacitor 200. The buffered contacts 120a and 120b reduce the possibility of punch-through, while a two-layer insulator of MIM capacitor improves capacitance provides design flexibility while minimizing the number of materials and process steps required to fabricate the device. Embodiments may be especially useful for devices with network arrays of resistors and capacitors, which may be used, for example, as filter banks for sensed signals. Persons of skill in the art will recognize additional advantages attendant to the embodiments described herein.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A semiconductor device comprising:
a dielectric layer over a back end of line (BEOL) metal layer;
a metallic resistive layer over the dielectric layer;
a resistor comprising a metallic resistive film that is a first portion of the metallic resistive layer; and
a metal-insulator-metal (MIM) capacitor comprising a top plate, a bottom plate, and an insulator between the top plate and the bottom plate, wherein the insulator of the MIM capacitor comprises at least two layers including a first layer that is a second portion of the metallic resistive layer and a second layer that is the dielectric layer, and wherein the metallic resistive layer comprises a metallic dielectric film.

2. The semiconductor device of claim 1, further comprising:
a first buffered contact comprising a first portion of a conductive metal layer and coupled between the metallic resistive film and a first via; and
a second buffered contact comprising a second portion of the conductive metal layer and coupled between the metallic resistive film and a second via.

3. The semiconductor device of claim 2, wherein the top plate of the MIM capacitor comprises a third portion of the conductive metal layer.

4. The semiconductor device of claim 3, wherein the first portion of the conductive metal layer, the second portion of the conductive metal layer, and the third portion of the conductive metal layer are coplanar.

5. The semiconductor device of claim 3, further comprising:
a third via coupled to the top plate of the MIM capacitor; and
an insulating layer over the conductive metal layer,
wherein the first, second and third vias extend through openings in the insulating layer.

6. The semiconductor device of claim 1, wherein the bottom plate of the MIM capacitor comprises a metal structure in the BEOL metal layer.

7. The semiconductor device of claim 1, wherein the metallic resistive film is coplanar with the second portion of the metallic resistive layer.

8. The semiconductor device of claim 1, wherein the metallic resistive layer comprises at least one of silicon chromium, nickel-chromium and titanium nitride.

9. The semiconductor device of claim 8, wherein the metallic resistive layer has a thickness of about 20-100 angstroms.

10. The semiconductor device of claim 1, wherein the dielectric layer has a dielectric constant (K) of about 5 or more, and a dielectric constant of the metallic resistive layer is greater than the dielectric constant of the dielectric layer.

11. The semiconductor device of claim 10, wherein the dielectric constant of the metallic resistive layer is greater than the dielectric constant of the dielectric layer by at least 5.

12. The semiconductor device of claim 1, wherein the BEOL metal layer is one level below a topmost metal layer of the semiconductor device.

13. A semiconductor device comprising:
a thin film resistor comprising a first portion of a metallic resistive layer; and
a metal-insulator-metal (MIM) capacitor comprising:
a bottom plate comprising a metal structure in a BEOL metal layer;
an insulator over the metal structure, the insulator including a first layer that is a second portion of the metallic resistive layer and a second layer that is a dielectric layer; and
a top plate comprising a first portion of a conductive metal layer over the insulator,
wherein the metallic resistive layer comprises a metallic dielectric film.

14. The semiconductor device of claim 13, further comprising:
a first buffered contact comprising a second portion of the conductive metal layer and coupled between the first portion of the metallic resistive layer and a first via; and
a second buffered contact comprising a third portion of the conductive metal layer and coupled between the first portion of the metallic resistive layer and a second via.

15. The semiconductor device of claim 14, wherein the first portion of the conductive metal layer, the second portion of the conductive metal layer, and the third portion of the conductive metal layer are coplanar.

16. The semiconductor device of claim 15, wherein the first portion of the metallic resistive layer is coplanar with the second portion of the metallic resistive layer.

17. The semiconductor device of claim 13, wherein the metallic resistive layer comprises at least one of silicon chromium, nickel-chromium and titanium nitride.

18. The semiconductor device of claim 17, wherein the dielectric layer has a dielectric constant (K) of about 5 or more, and a dielectric constant of the metallic resistive layer is greater than the dielectric constant of the dielectric layer.

19. A method of forming a semiconductor device, the method comprising:
- forming a back end of line (BEOL) metal layer;
- forming a dielectric layer over the BEOL metal layer;
- forming a metallic resistive layer over the dielectric layer;
- forming a resistor comprising a first portion of the metallic resistive layer; and
- forming a metal-insulator-metal (MIM) capacitor comprising a top plate, a bottom plate, and an insulator between the top plate and the bottom plate, wherein the insulator of the MIM capacitor comprises at least two layers including a second portion of the metallic resistive layer and the dielectric layer, and wherein the metallic resistive layer comprises a metallic dielectric film.

20. The method of claim 19, further comprising:
- forming a conductive layer over the resistive layer; and
- forming first and second buffered contacts of the resistor and a top plate of the MIM capacitor by patterning the conductive layer.

* * * * *